(12) United States Patent
Wu et al.

(10) Patent No.: US 8,456,342 B2
(45) Date of Patent: Jun. 4, 2013

(54) SWITCH SEQUENCING FOR CODE-RANGE-SPECIFIC LINEARITY IMPROVEMENT IN DIGITAL-TO-ANALOG CONVERTERS

(75) Inventors: Honglei Wu, Sunnyvale, CA (US); Mengchang Doong, Sunnyvale, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 133 days.

(21) Appl. No.: 13/099,797

(22) Filed: May 3, 2011

(65) Prior Publication Data
US 2012/0280845 A1  Nov. 8, 2012

(51) Int. Cl.
*H03M 1/66* (2006.01)
(52) U.S. Cl.
USPC ........... 341/150; 341/144; 341/153; 341/120; 341/136
(58) Field of Classification Search
USPC .......................... 341/153, 120, 136, 144, 150
See application file for complete search history.

(56) References Cited

U.S. PATENT DOCUMENTS

| | | | | |
|---|---|---|---|---|
| 6,166,670 | A * | 12/2000 | O'Shaughnessy | 341/136 |
| 7,026,967 | B2 * | 4/2006 | Eloranta | 341/120 |
| 7,369,077 | B2 * | 5/2008 | Carroll | 341/153 |
| 2005/0007268 | A1 | 1/2005 | Toda | 341/154 |
| 2006/0114138 | A1 * | 6/2006 | Eloranta | 341/144 |

OTHER PUBLICATIONS

Hao, Miin-Jong, "A Companding Technique for PAPR Reduction of OFDM Systems", IEICE Trans. Commun., vol. E91-B, No. 3; pp. 935-938, Mar. 2008.
Miki, T. et al., "An 80-MHz 8-bit CMOS D/A Converter," IEEE Journal of Solid-State Circuits, vol. SC-21, No. 6, 6 pages, Dec. 1986.
Pelgrom, M.J.M. et al., "Matching Properties of MOS Transistors," IEEE Journal of Solid-State Circuits, vol. 24, No. 5, 8 pages, Oct. 1989.
Nakamura, Y. et al., "A 10-bit 70MS/s CMOS D/A Converter," IEEE Journal of Solid-State Circuits, vol. 26, 2 pages, Apr. 1991.
Henriques, B.G. et al., "A High-Speed Programmable CMOS Interface System Combining D/A Conversion and FIR Filtering," IEEE Journal of Solid-State Circuits, vol. 29, No. 8, 6 pages, Aug. 1994.
Bastos, J. et al., "A 12-Bit Intrinsic Accuracy High-Speed CMOS DAC," IEEE Journal of Solid-State Circuits, vol. 33, No. 12, 11 pages, Dec. 1998.
Lin, Chi-Hung et al., "A 10-b, 500-MSample/s CMOS DAC in 0.6 $mm^2$," IEEE Journal of Solid-State Circuits, vol. 33, No. 12, 11 pages, Dec. 1998.
Van der Plas, G.A.M. et al., "A 14-bit Intrinsic Accuracy $Q^2$ *Random Walk* CMOS DAC," IEEE Journal of Solid-State Circuits, vol. 34, No. 12, 11 pages, Dec. 1999.

(Continued)

*Primary Examiner* — Jean B Jeanglaude
(74) *Attorney, Agent, or Firm* — King & Spalding L.L.P.

(57) ABSTRACT

A digital-to-analog converter (DAC) uses thermometer coding over a certain code range. A switch array for the certain code range is implemented into a smaller area of the integrated circuit die so as to take advantage of the lower gradient inherent in the smaller area. By implementing the certain input code range into the smaller switch array area, further improved linearity in that input code range is achieved at the expense of worse linearity in the other input code ranges, but without increasing power consumption and/or chip-area of the integrated circuit die.

22 Claims, 5 Drawing Sheets

OTHER PUBLICATIONS

Cong, Y. et al., "Switching Sequence Optimization for Gradient Error Compensation in Thermometer-Decoded DAC Arrays," IEEE Transactions on Circuits and Systems—II: Analog and Digital Signal Processing, vol. 47, No. 7, 11 pages, Jul. 2000.

Deveugele, J. et al., "A Gradient-Error and Edge-Effect Tolerant Switching Scheme for a High-Accuracy DAC," IEEE Transactions on Circuits and Systems—I: Regular Papers, vol. 51, No. 1, 5 pages, Jan. 2004.

Chan, K.L. et al., "A 14b 100MS/s DAC with Fully Segmented Dynamic Element Matching," IEEE International Solid-State Circuits Conference 2006, Session 31, Digest of Technical Papers, 10 pages, Feb. 2006.

Clara, M. et al., "A 1.5V 200 MS/s 13b 25mW DAC with Randomized Nested Background Calibration in 0.13 µm CMOS," IEEE Solid-State Circuits Conference 2007, Session 13, Digest of Technical Papers, 3 pages, Feb. 2007.

Vadipour, M., "Gradient Error Cancellation and Quadratic Error Reduction in Unary and Binary D/A Converters," IEEE Transactions on Circuits and Systems—II: Analog and Digital Signal Processing, vol. 50, No. 12, 6 pages, Dec. 2003.

* cited by examiner

FIGURE 5 (Prior Technology)

FIGURE 6 (Prior Technology)

SWITCH SEQUENCING FOR CODE-RANGE-SPECIFIC LINEARITY IMPROVEMENT IN DIGITAL-TO-ANALOG CONVERTERS

TECHNICAL FIELD

The present disclosure relates generally to digital-to-analog converters (DACs), and more particularly to a digital-to-analog converter (DAC) incorporating thermometer coding and having improved linearity over a certain code-range.

BACKGROUND

There are gradients in the transistor values of switching transistors within a DAC array. These gradients are typically caused by process inaccuracies, e.g., fabrication inaccuracies such as well-proximity effect, length of diffusion effect, faulty oxide irregularities, poor polysilicon etching and/or implant non-uniformities. Such process gradients can cause normally identical transistors to pass different amounts of current through one or more of the transistors in the DAC switching array.

In high resolution DACs, the effects of these gradients can become a limiting factor of linearity performance, including differential-nonlinearity (DNL) and integral-nonlinearity (INL). Numerous techniques have been proposed to alleviate this problem by either employing specific switch sequences designed to overcome the gradient effect or by using random switch sequences. Present technologies have focused on general purpose DACs designed to have improved linearity uniformly over the entire code range of the DAC. However chip-area and/or power consumption will increase in order to improve linearity over the entire code range of the DAC.

While many applications require DACs with uniform linearity performance across the entire input code range, some applications only require good linearity performance in a certain input code range while allowing worse linearity in other code ranges. For example, in advanced communications applications, orthogonal frequency division multiplexing (OFDM) is often used. A DAC used in a OFDM communications system need only have good linearity performance in the middle code range, while worse linearity is acceptable on either side of this middle code range.

SUMMARY

Therefore, it is desirable in applications requiring good DAC linearity only over a certain code range to be able to provide such a DAC without having to increase power consumption and/or chip-area (integrated circuit die area) for the improved linearity over the certain code range. According to the teachings of this disclosure, a particular code range is implemented into a smaller area of a switch array so as to take advantage of the smaller gradient inherent in the smaller area of the switch array. By implementing the certain (desired) code range into a smaller area of the integrated circuit die, further improved linearity in that code range is achieved at the expense of worse linearity in the other code ranges, but without increasing power consumption and/or chip-area. This feature is especially advantageous for such specialty application as a DAC for an OFDM transmitter.

According to a specific example embodiment of this disclosure, a method of switch sequencing for code range specific linearity improvement in a digital-to-analog converter (DAC) comprises the steps of: providing an inner switch array for switching digital input values from x to y; and providing an outer switch array for switching digital input values from 0 to x−1 and y+1 to k; wherein the inner switch array gradient is less than the outer switch array gradient, and whereby differential-nonlinearity (DNL) and integral-nonlinearity (INL) of the inner switch array is better then the DNL and INL of the outer switch array.

According to another specific example embodiment of this disclosure, an apparatus for switch sequencing in a digital-to-analog converter (DAC) comprises: an inner switch array comprising a plurality of inner switch elements, wherein the plurality of inner switch elements are controlled by digital input values from x to y; and an outer switch array comprising a plurality of outer switch elements, wherein the plurality of outer switch elements are controlled by digital input values from 0 to x−1 and y+1 to k; wherein an area of the inner switch array is selected to minimize gradient so as to improve differential-nonlinearity (DNL) and integral-nonlinearity (INL) of the inner switch array for digital input values from x to y, and each of the plurality of inner switch elements is adjacent to another.

BRIEF DESCRIPTION OF THE DRAWINGS

A more complete understanding of the present disclosure thereof may be acquired by referring to the following description taken in conjunction with the accompanying drawings wherein.

Figure 1:
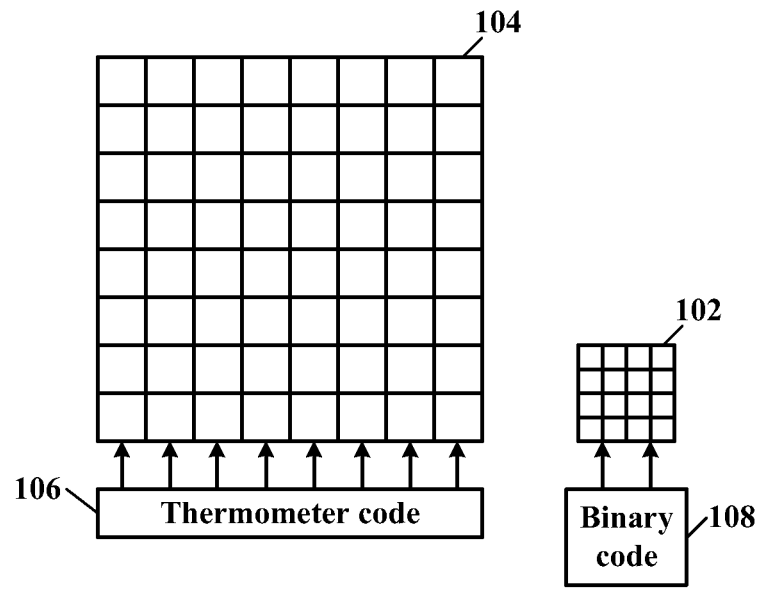
FIG. 1 illustrates a schematic diagram of switch arrays for a hybrid digital-to-analog converter (DAC) comprising thermometer and binary coded switch arrays, according to the teachings of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of an example embodiment is schematically illustrated. Like elements in the drawings will be represented by like numbers, and similar elements will be represented by like numbers with a different lower case letter suffix.

Referring to FIG. 1, depicted is a schematic diagram of switch arrays for a hybrid digital-to-analog converter (DAC) comprising thermometer and binary coded switch arrays, according to the teachings of this disclosure. A hybrid DAC may comprise a thermometer coded switch array 104 controlled by thermometer code logic 106, and a binary coded switch array 102 controlled by binary code logic 108. Hybrid DACs are used because straight binary coding may increase noise as the digital inputs change to a more significant bit(s). For example, stepping up from binary "0111" to binary "1000" will change four (4) bits simultaneously, thereby generating a significant amount of switching noise. Because of this inherent potential for noise generation when switching values in a binary coded DAC, the binary coded DAC is usually limited to 8 bit applications. Where greater resolution and lower noise are required, thermometer coding is used in converting digital input values to an analog output signal equivalent. Each bit of the thermometer coded digital data will control a step, e.g., voltage, current, or resistance, of equal value (weight), thus providing an analog equivalent proportional to the decoded digital data.

Thermometer coding is used because the number of DAC cells turned on are proportional to the value of the digital input data, thus monotonicity can be assured. This provides a lower noise analog output signal because there is less switching noise. The drawback to thermometer coding is the relatively large amount of die area require in an integrated circuit. Therefore to increase resolution without have to resort to use of excessive die area, a combination of thermometer coding combined with a conventional binary-coded DAC may be used to create a segmented or "hybrid" DAC. The thermometer coding is used for the most significant bits (MSBs) and the binary coding is used for the least significant bits (LSBs). According to the teachings of this disclosure, thermometer coding can be used with any DAC employing a switch array of any type, including but not limited to: a current switch array, a capacitor switch array, and a resistor switch array.

Improvements in the random matching performance of the DAC elements can be used to improve the linearity of a DAC, but at the price of higher chip-area and/or use of complex switching sequences. However, at a given gradient, there is a limit on how much of an improvement in linearity that can be achieved by optimizing the switch sequences. Once the linearity improvement limit at a given gradient has been reached, further linearity improvements require increased element size and/or calibration at the expense of having to increase power usage and/or chip-area.

For a given gradient, a smaller switching array will have a smaller overall gradient error, resulting in better linearity when using any given switch sequence. Therefore by choosing to partition the switch array so that the code range where good linearity is desired is located within the smaller area switch array instead of spreading the code evenly inside a larger area switch array, an improvement in the linearity within that specific code range can be achieved without having to increase power usage and/or chip-area.

Figure 2:
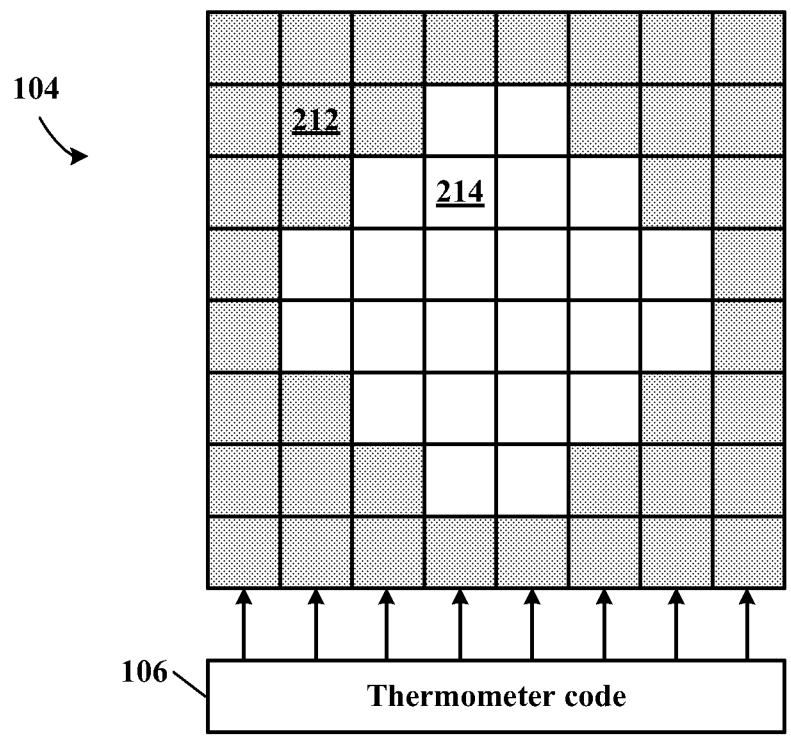
FIG. 2 illustrates a diagram of a thermometer coded switch array, according to the teachings of this disclosure.

Referring to FIG. 2, depicted is a diagram of a thermometer coded switch array, according to the teachings of this disclosure. A thermometer coded DAC comprising the thermometer coded switch array 104 controlled by thermometer code logic 106 is shown having two switch array areas, an inner array area comprising a plurality of switch elements 214 (represented by white squares) and an outer array area comprising a plurality of switch elements 212 (represented by shaded squares). The switch array 104 has an input code range from 0 to k, and better linearity is desired within the input code range from x to y, where $0<x<y<k$. If the input code range of x to y is implemented in the inner array area comprising the plurality of switch elements 214 (represented by white squares), the linearity within this code range is improved without increasing the power usage or chip-area. The only penalty in doing this is that the code ranges other then x to y are now implemented within a square-ring shaped outer area comprising the plurality of switch elements 212 (represented by shaded squares). The plurality of switch elements 212 are farther away from each other, resulting in worse gradient and worse linearity. However this is acceptable for applications like DACs in OFDM transmitters. The aforementioned thermometer DAC implementation may also be part of a thermometer/binary hybrid type DAC as more fully described hereinabove.

Figure 3:
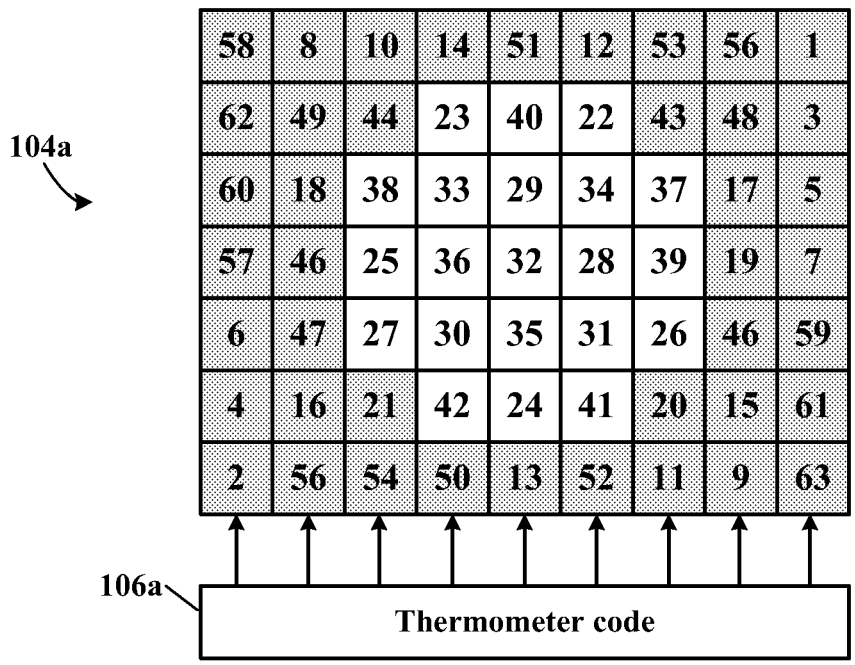
FIG. 3 illustrates a diagram of a switching sequence for a thermometer coded switch array, according to a specific example embodiment of this disclosure.

Referring to FIG. 3, depicted is a diagram of a switching sequence for a thermometer coded switch array, according to a specific example embodiment of this disclosure. A six-bit thermometer-coded DAC is shown in FIG. 3 with a smaller inner array area having an input code range of 22 to 42, and the outer array area having input code ranges of 1 to 21, and 43 to 63. The gradient is less in the closely spaced and smaller switch array area for the desired input code range of 22 to 42, thereby improving linearity of the switch array for these input code ranges.

Figure 4:
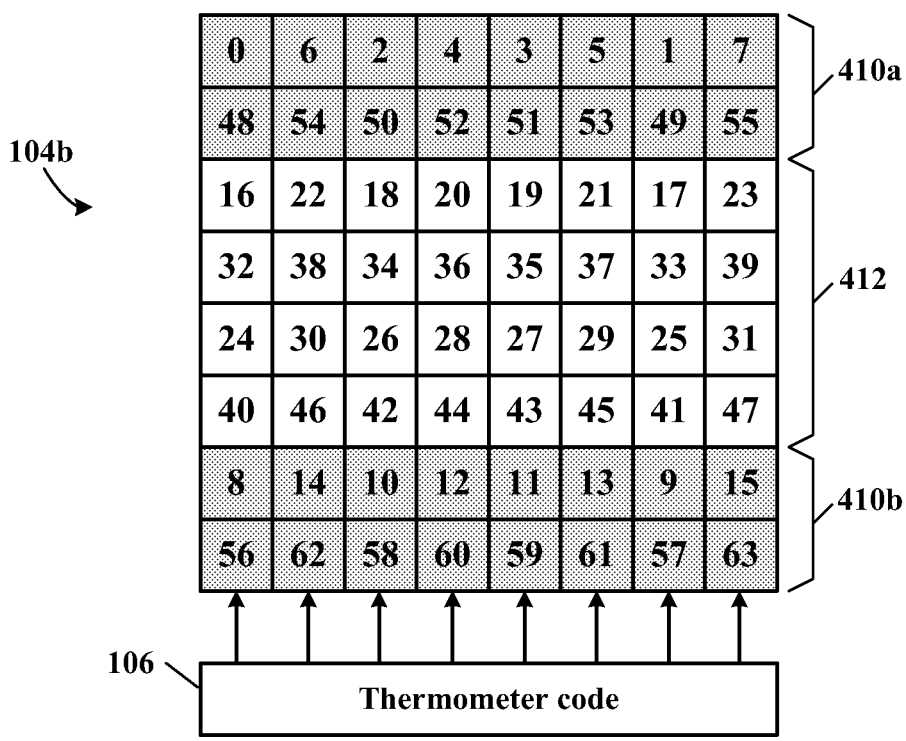
FIG. 4 illustrates a diagram of a switching sequence for a thermometer coded switch array, according to another specific example embodiment of this disclosure.

Referring to FIG. 4, depicted is a diagram of a switching sequence for a thermometer coded switch array, according to another specific example embodiment of this disclosure. A six-bit thermometer-coded DAC is shown in FIG. 4 with a smaller inner array area for the middle code elements having an input code range of 16 to 47, and the outer array area for the side code elements having input code ranges of 1 to 15, and 48 to 63. In these array area layouts, the gradient in the vertical direction has more impact on INL than the gradient in the horizontal direction. Therefore by defining the rows as the most significant bits (MSB) and the columns as the least significant bits (LSB), better INL can be achieved.

Figure 5:
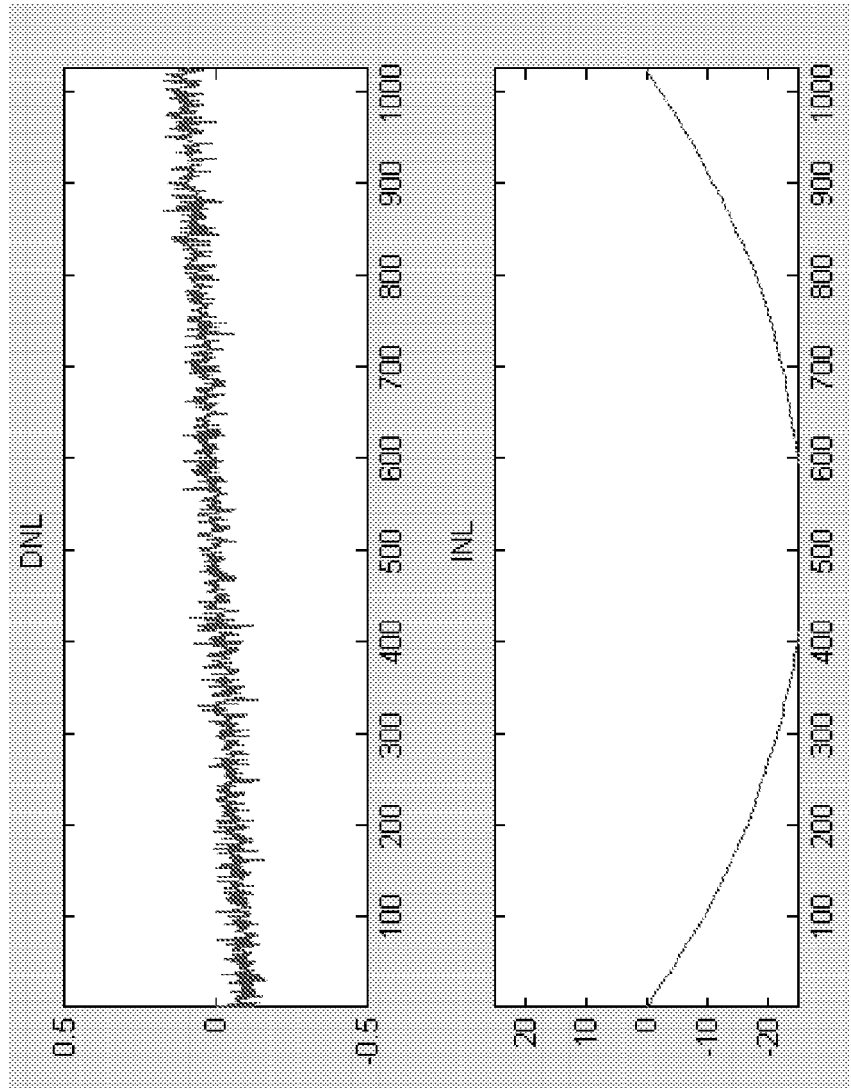
FIG. 5 illustrates a graph of prior technology DNL and INL over an entire range of input codes for a switch array having sequential switching without optimization.

Referring to FIG. 5, depicted is a graph of prior technology DNL and INL over an entire range of input codes for a switch array having sequential switching without optimization. The bow shaped INL curve means poor linearity which causes a lot of distortion in the signal.

Figure 6:
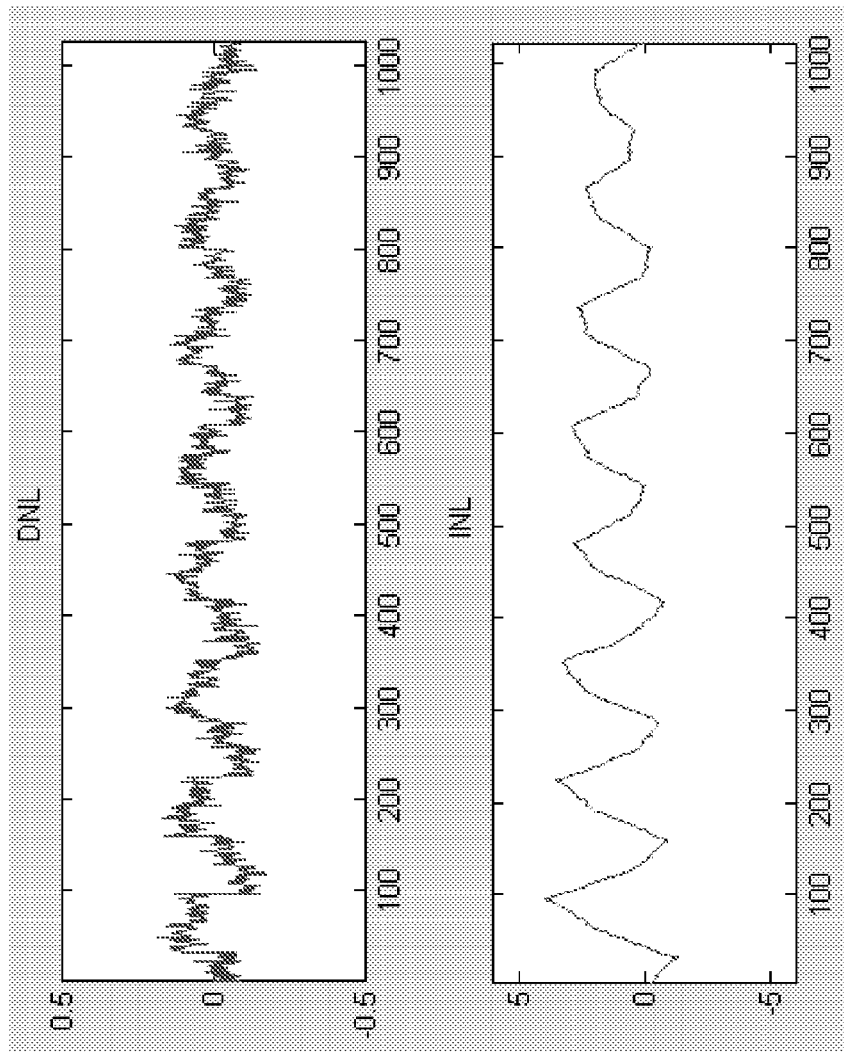
FIG. 6 illustrates a graph of prior technology DNL and INL over an entire range of input codes for a switch array having optimized switch sequences for uniform linearity improvement.

Referring to FIG. 6, depicted is a graph of prior technology DNL and INL over an entire range of input codes for a switch array having optimized switch sequences for uniform linearity improvement. In this example, linearity is improved uniformly across the entire input code range.

Figure 7:
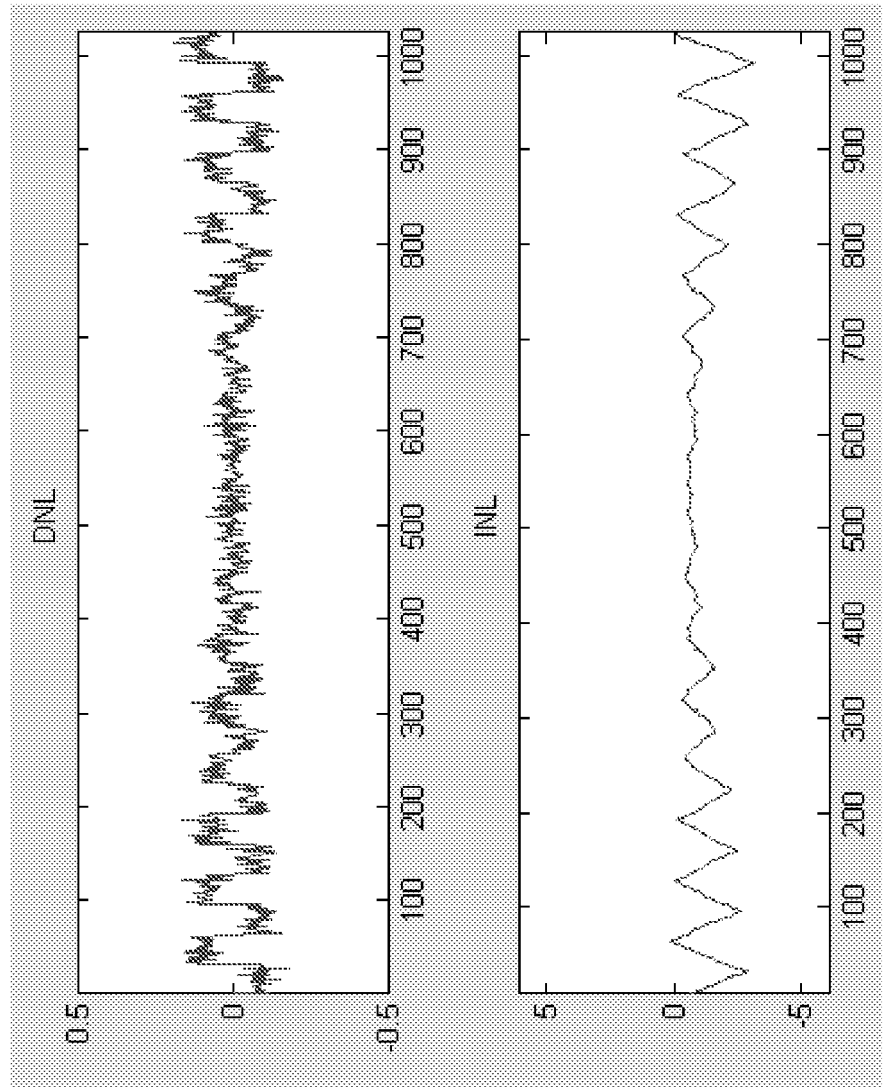
FIG. 7 illustrates a graph of prior technology DNL and INL over an entire range of input codes for a switch array having optimized switch sequences for a middle input code range, according to the teachings of this disclosure.

Referring to FIG. 7, depicted is a graph of DNL and INL over an entire range of input codes for a switch array having optimized switch sequences for a middle input code range, according to the teachings of this disclosure. In this example, both DNL and INL are improved for the desired middle input code range because of the smaller and closer array area used for the middle input codes.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A method of switch sequencing for code range specific linearity improvement in a digital-to-analog converter (DAC), said method comprising the steps of:
   providing a thermometer coded switch array wherein switches are arranged in columns and rows;
   providing an inner switch array of said thermometer coded switch array for switching digital input values from x to y; and
   providing an outer switch array of said thermometer coded switch array for switching digital input values from 0 to x−1 and y+1 to k;
   wherein the inner switch array gradient is less than the outer switch array gradient, and whereby differential-nonlinearity (DNL) and integral-nonlinearity (INL) of the inner switch array is better then the DNL and INL of the outer switch array.

2. The method according to claim 1, further comprising the steps of controlling the inner and outer switch arrays with thermometer code logic.

3. The method according to claim 1, wherein the inner switch array is surrounded by the outer switch array.

4. The method according to claim 1, wherein the outer switch array is segmented above and below the inner switch array.

5. The method according to claim 1, further comprising the steps of assigning the digital input values' most significant bits (MSBs) to rows of the inner switch array and least significant bit (LSBs) to columns of the inner switch array.

6. The method according to claim 2, further comprising the steps of combining the thermometer code logic switch array selection for the digital input values' most significant bits (MSBs) and binary code logic switch array selection for the digital input values' least significant bits (LSBs) to produce an analog output signal.

7. The method according to claim 1, wherein the inner and outer switch arrays switch current values to produce an analog output signal.

8. The method according to claim 1, wherein the inner and outer switch arrays switch capacitor values to produce an analog output signal.

9. The method according to claim 1, wherein the inner and outer switch arrays switch resistor values to produce an analog output signal.

10. The method according to claim 1, further comprising the step of fabricating the inner and outer switch arrays on an integrated circuit die.

11. An apparatus for switch sequencing in a digital-to-analog converter (DAC), comprising:
    a thermometer coded switch array wherein switches are arranged in columns and rows;
    wherein an inner switch array of said thermometer coded switch array comprises a plurality of inner switch elements, wherein the plurality of inner switch elements are controlled by digital input values from x to y; and
    wherein an outer switch array of said thermometer coded switch array comprises a plurality of outer switch elements, wherein the plurality of outer switch elements are controlled by digital input values from 0 to x−1 and y+1 to k;
    wherein an area of the inner switch array is selected to minimize gradient so as to improve differential-nonlinearity (DNL) and integral-nonlinearity (INL) of the inner switch array for digital input values from x to y, and each of the plurality of inner switch elements is adjacent to another.

12. The apparatus according to claim 11, further comprising thermometer code logic for controlling the inner and outer switch arrays.

13. The apparatus according to claim 11, wherein the inner switch array is surrounded by the outer switch array.

14. The apparatus according to claim 11, wherein the outer switch array is segmented above and below the inner switch array.

15. The apparatus according to claim 11, wherein rows of the inner switch array are controlled by most significant bits (MSBs) of the digital input value and columns of the inner switch array are controlled by least significant bits (LSBs) of the digital input value.

16. The apparatus according to claim 12, further comprising another switch array controlled by binary code logic for the digital input value least significant bits (LSBs), and the thermometer code logic for the digital input value most significant bits (MSBs) to produce an analog output signal.

17. The apparatus according to claim 11, wherein the inner and outer switch arrays switch current values to produce an analog output signal.

18. The apparatus according to claim 11, wherein the inner and outer switch arrays switch capacitor values to produce an analog output signal.

19. The apparatus according to claim 11, wherein the inner and outer switch arrays switch resistor values to produce an analog output signal.

20. The apparatus according to claim 11, wherein the thermometer coded switch array with said inner and outer switch arrays is formed within an integrated circuit die.

21. The apparatus according to claim 20, wherein the integrated circuit die further include other support circuits for the DAC.

22. The apparatus according to claim 20, wherein the DAC is used in an orthogonal frequency division multiplexing (OFDM) system.

* * * * *